(12) United States Patent
Sampat

(10) Patent No.: US 6,809,525 B1
(45) Date of Patent: Oct. 26, 2004

(54) METHOD AND SYSTEM FOR ESTIMATING CONDUCTOR LOSSES IN A TRANSFORMER

(75) Inventor: Mahesh P. Sampat, Athens, GA (US)

(73) Assignee: ABB Technology AG, Zurich (CH)

( * ) Notice: Subject to any disclaimer, the term of this patent is extended or adjusted under 35 U.S.C. 154(b) by 74 days.

(21) Appl. No.: 10/335,642

(22) Filed: Dec. 31, 2002

(51) Int. Cl.⁷ .................. G01R 31/02; G01R 31/06
(52) U.S. Cl. ................. 324/546; 324/547; 324/726
(58) Field of Search ................. 324/546, 547, 324/726, 772, 509, 511, 512, 522, 525

(56) References Cited

U.S. PATENT DOCUMENTS 3,667,034 A * 5/1972 Freeze .................... 324/547
5,283,527 A * 2/1994 DeBiasi .................. 324/391
6,045,527 A * 4/2000 Appelbaum et al. ......... 604/22

* cited by examiner

Primary Examiner—Vincent Q. Nguyen
(74) Attorney, Agent, or Firm—Woodcock Washburn LLP

(57) ABSTRACT

A preferred method for estimating conductor losses in a transformer having a first and a second winding includes energizing the first winding while the second winding is short-circuited by an electrical conductor so that power is supplied to the first winding and a portion of the power is dissipated due to a resistance associated with the electrical conductor. A preferred method also includes measuring the power supplied to the first winding, calculating the portion of the power dissipated due to the resistance associated with the electrical conductor, and subtracting the portion of the power dissipated due to the resistance associated with the electrical conductor from the power supplied to the first winding.

34 Claims, 6 Drawing Sheets

METHOD AND SYSTEM FOR ESTIMATING CONDUCTOR LOSSES IN A TRANSFORMER

FIELD OF THE INVENTION

The present invention relates to transformers. More particularly, the invention relates to a method and a system for estimating the conductor losses that occur in transformers during operation thereof.

BACKGROUND OF THE INVENTION

Transformers are alternating current ("ac") devices that transfer energy from one ac circuit to another ac circuit. FIG. 1 depicts a single-phase transformer 100. The transformer 100 comprises a laminated iron core 101, a high-voltage ("HV") winding 102, and a low-voltage ("LV") winding 104. The HV and LV windings 102, 104 are each wound around the core 101. The HV winding 102 can be electrically coupled to an external ac power source (not shown), and the LV winding 104 can be electrically coupled to an external load (not shown) during normal (in-service) operation of the transformer 100.

Energizing the power source causes an alternating current to flow within the HV winding 102. The alternating current induces an alternating magnetic flux within the core 101. The core 101 conducts the magnetic flux to the LV winding 104. The magnetic flux induces a voltage across the LV winding 104. The voltage across each of the HV and LV windings 102, 104 is proportional to the number of turns in the respective HV and LV windings 102, 104. The resulting current in each of the HV and LV windings 102, 104 is inversely proportional to the number of turns in the respective HV and LV windings 102, 104.

Various losses occur in the transformer 100 during operation thereof. These losses are typically classified as "core" losses and "conductor" (copper) losses. Core losses result from the alternating magnetic flux within the core 101. More particularly, the alternating magnetic flux causes eddy currents and hysteresis within the core 101, which decrease the amount of energy transferred from the HV winding 102 to the LV winding 104. Conductor losses result from the resistance of the HV and LV windings 102, 104 to the flow of current therein (losses of this type are commonly referred to as "$IR^2$" losses). These losses represent energy losses that occur during the transformation of power by the transformer 100, and can contribute substantially to the operating cost of the transformer 100.

In a competitive sales environment, the decision of a potential customer whether to purchase a transformer such as the transformer 100 is often based on the concept of total owning cost. In other words, the purchaser typically seeks the lowest combination (sum) of initial purchase price and projected operating cost over the life of the transformer. The purchaser is usually willing to pay more for a transformer having a relatively low estimated operating cost. Conversely, a transformer with a relatively high estimated operating cost will usually sell for a lower price. Hence, transformer manufacturers are subject to an economic penalty for transformers having relatively high operating costs.

Most purchasers of transformers such as the transformer 100 expect to receive a certified report from the manufacturer documenting the operating cost of the transformer, reflected in current monetary terms. Hence, transformer losses are usually measured by the manufacturer prior to shipping the transformer to the purchaser.

Conductor losses are typically measured using a so-called "short-circuit" test. The short-circuit test is performed by placing a "shorting bar" 50 (or other suitable electrical conductor) across one of the windings (typically the LV winding 104) of the transformer 100 (see FIG. 1). In practice, the shorting bar is electrically coupled to a first and a second bushing 106, 107 of the transformer 100. The first and second bushings 106, 107 are normally used to electrically couple the external load to the LV winding 104 during normal operation of the transformer 100.

A suitable ac power source 51, wattmeter 52, and ammeter 54 are electrically coupled to one of the windings 102, 104 (typically the HV winding 102) of the transformer 100 as shown in FIG. 1. In practice, the wattmeter 52 is electrically coupled to a third and a fourth bushing 108, 109 of the transformer 100. The third and fourth bushings 108, 109 are normally used to electrically couple the external power source to the HV winding 102 during normal operation of the transformer 100.

Energizing the power source 51 causes an alternating current to flow through the HV winding 102. Preferably, the voltage produced by the power source 51 is adjusted so that the alternating current flowing through the HV winding 102 (as measured by the ammeter 54) is approximately equal to the rated current for the HV winding 102. The alternating current within the HV winding 102 induces an alternating magnetic flux in the core 101. The core 101 conducts the magnetic flux to the LV winding 104. The magnetic flux induces a voltage across the LV winding 104.

The LV winding 104 is short-circuited by the shorting bar 50. The induced voltage across the LV winding 104 therefore causes a current to flow through the LV winding 104.

The wattmeter 52 measures the power delivered to the HV winding 102. The power delivered to the HV winding 102 is approximately equal to the conductor losses of the transformer 100 (including the conductor losses associated with the LV winding 104) and, in addition, the power losses associated with the shorting bar 50.

The power losses associated with the shorting bar 50 include the losses caused by the resistance of the shorting bar 50, i.e., the $IR^2$ losses of the shorting bar 50. The losses associated with the shorting bar 50 also include the losses caused by the contact resistance between the shorting bar 50 and the first and second bushings 106, 107.

The power losses associated with the shorting bar 50 are typically included in the value of the conductor losses used to estimate the operating cost of the transformer 100. Thus, the transformer manufacturer is subject to an economic penalty, in the form of a lower purchase price, due to the inclusion of the power losses associated with the shorting bar 50 with the estimated conductor losses.

SUMMARY OF THE INVENTION

A preferred method for estimating conductor losses in a transformer having a first and a second winding comprises energizing the first winding while the second winding is short-circuited by an electrical conductor so that power is supplied to the first winding and a portion of the power is dissipated due to a resistance associated with the electrical conductor. A preferred method also comprises measuring the power supplied to the first winding, calculating the portion of the power dissipated due to the resistance associated with the electrical conductor, and subtracting the portion of the power dissipated due to the resistance associated with the electrical conductor from the power supplied to the first winding.

A preferred method for estimating conductor losses in a transformer comprises supplying power to a first winding of the transformer while a second winding of the transformer is short-circuited by an electrical conductor, and measuring the power supplied to the first winding. A preferred method also comprises calculating power dissipated by the electrical conductor in response to supplying power to the first winding, and subtracting the power dissipated by the electrical conductor from the power supplied to the first winding.

Another preferred method for estimating conductor losses in a transformer comprises electrically coupling an electrical conductor to a first and a second end of a first winding of the transformer, and energizing a second winding of the transformer. A preferred method also comprises measuring power delivered to the second winding, calculating power dissipated by resistance associated with the electrical conductor in response to energization of the second winding, and subtracting the power dissipated by the resistance associated with the electrical conductor from the power delivered to the first winding.

Another preferred method for estimating conductor losses in a transformer comprises supplying power to a first winding of the transformer while a first and a second end portion of a second winding of the transformer are electrically coupled by an electrical conductor, and quantifying the power supplied to the first winding of the transformer. A preferred method also comprises quantifying power losses across the electrical conductor in response to supplying power to the first winding of the transformer, and subtracting the power losses from the power supplied to the first winding of the transformer.

Another preferred method for estimating conductor losses in a transformer comprises energizing a first winding of the transformer by supplying power to the first winding while a second winding of the transformer is short-circuited by an electrical conductor, and measuring the power supplied to the first winding. A preferred method also comprises adjusting the measured power to account for power losses associated with the electrical conductor in response to the energization of the first winding thereby providing an estimate of conductor losses in the transformer.

A preferred embodiment of a system for estimating conductor losses in a transformer comprises a power supply for energizing a first winding of the transformer, a wattmeter for measuring power supplied to the first winding, an ammeter for measuring a current in the first winding, a voltmeter for measuring a voltage across an electrical conductor electrically coupled to a first and a second end of a second winding of the transformer, and a computing device.

The computing device comprises an input/output interface for communicating with the power supply, wattmeter, ammeter, and voltmeter, and a central processing unit electrically coupled to the input/output interface. The central processing unit comprises a processor electrically coupled to the input/output interface, a memory-storage device electrically coupled to the processor, and a power supply electrically coupled to the processor and the memory-storage device.

The central processing unit also comprises a set of computer-executable instructions stored on the memory-storage device for causing the power source to energize the first winding, causing the wattmeter to measure the power supplied to the first winding, causing the ammeter to measure the current in the first winding, causing the voltmeter to measure the voltage across the electrical conductor, calculating power dissipated by the electrical conductor in response to energization of the first winding based on the current in the first winding and the voltage across the electrical conductor, and subtracting the power dissipated by the electrical conductor from the power supplied to the first winding.

BRIEF DESCRIPTION OF THE DRAWINGS

The foregoing summary, as well as the following detailed description of a presently-preferred embodiment, is better understood when read in conjunction with the appended drawings. For the purpose of illustrating the invention, the drawings show an embodiment that is presently preferred. The invention is not limited, however, to the specific instrumentalities disclosed in the drawings. In the drawings.

DESCRIPTION OF PREFERRED EMBODIMENTS

Figure 1:
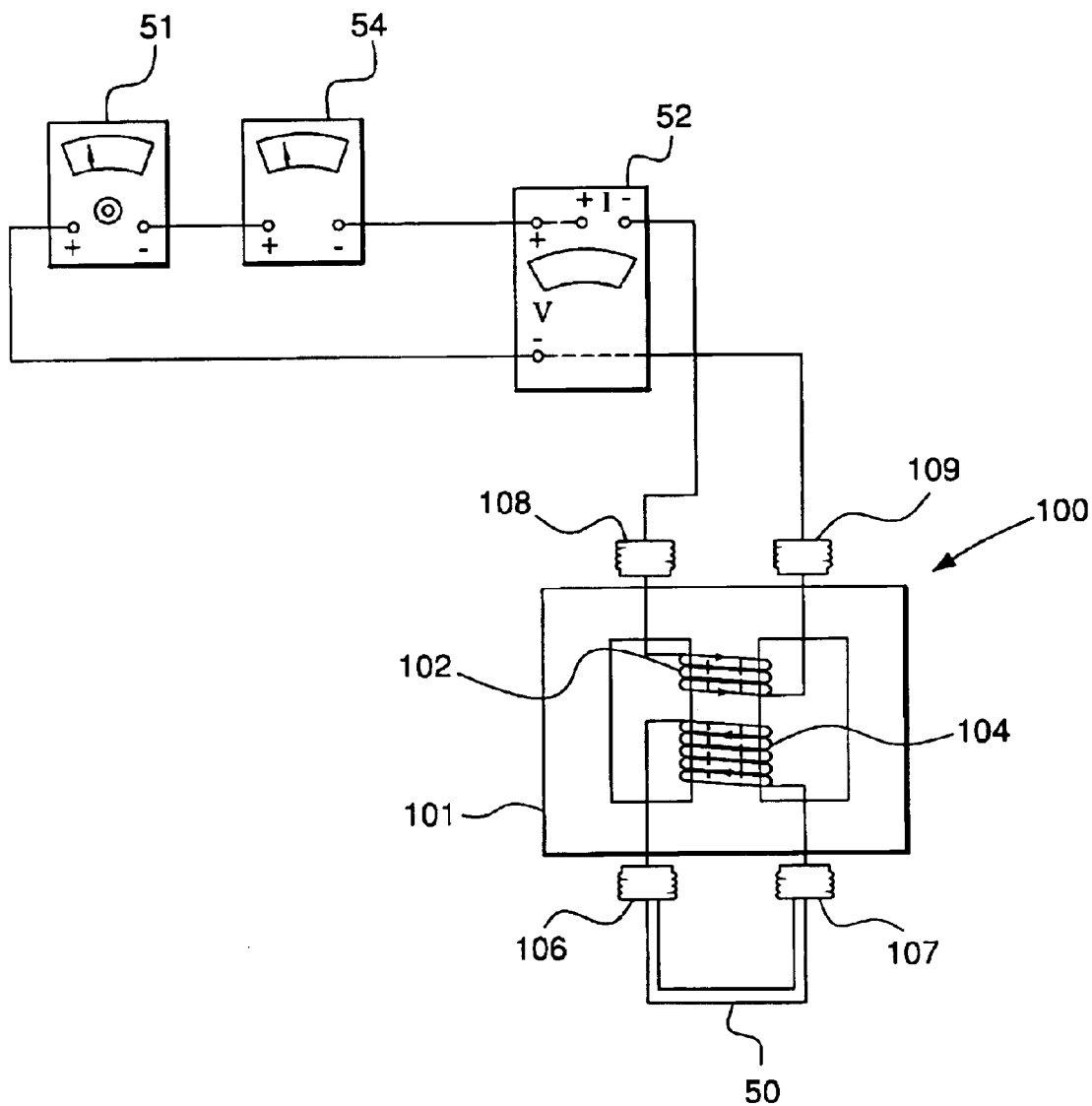
FIG. 1 is a diagrammatic illustration of a transformer, and instrumentation for estimating conductor losses in the transformer using conventional techniques.
Figure 2:
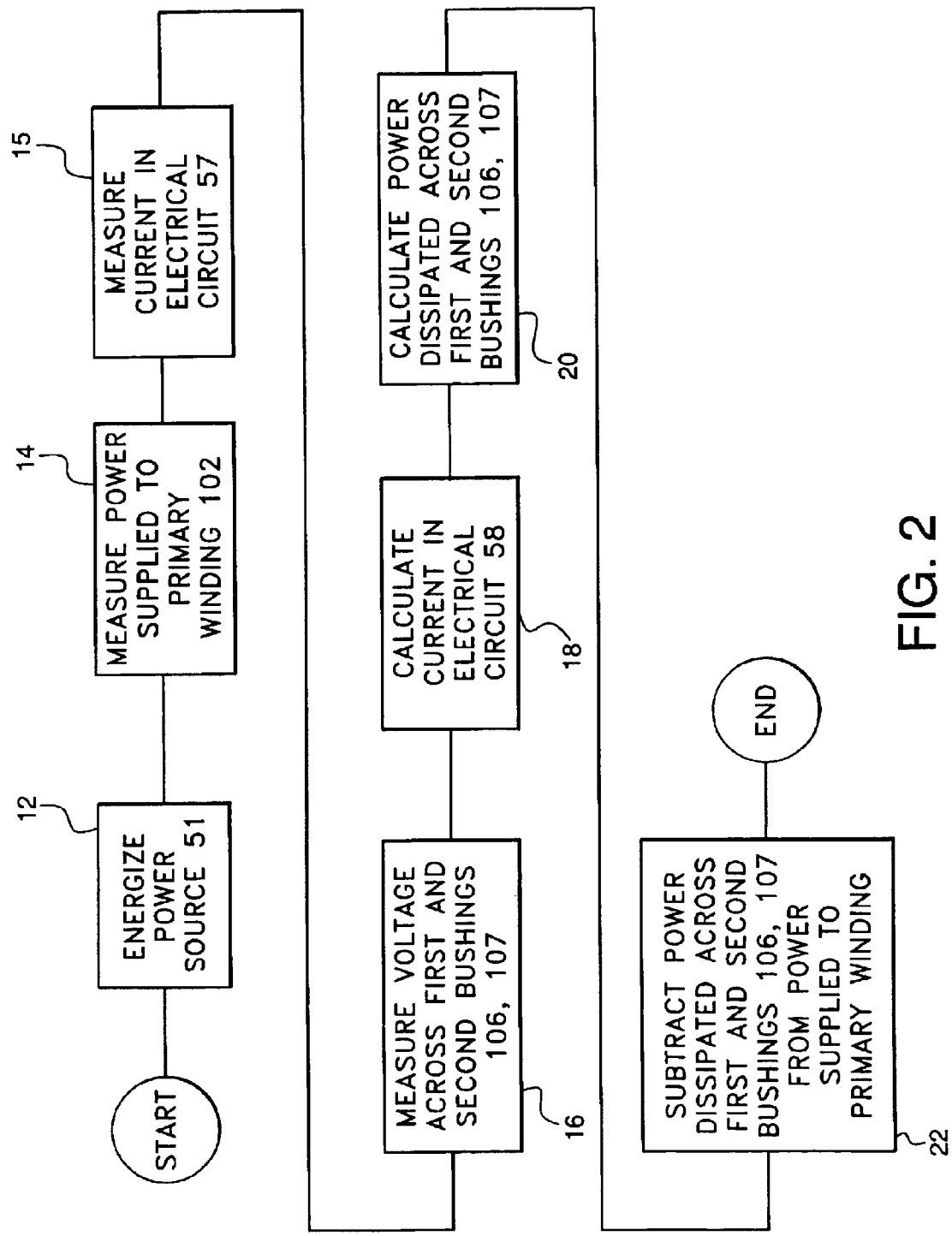
FIG. 2 is a flow diagram depicting a preferred method for estimating conductor losses in a transformer such as the transformer shown in FIG. 1.

A preferred method 10 for estimating the conductor losses in a transformer is depicted in FIG. 2. The method 10 is described herein in connection with the transformer 100. The above description of the transformer 100 is thus applicable to following description of the method 10, and is not repeated herein for brevity. It should be noted that the method 10 is described in connection with the transformer 100 for exemplary purposes only. The method 10 can be used to measure the conductor losses in virtually any type of transformer, including power transformers and distribution transformers, single and multi-phase transformers, and shell-type and core-type transformers.

Figure 3:
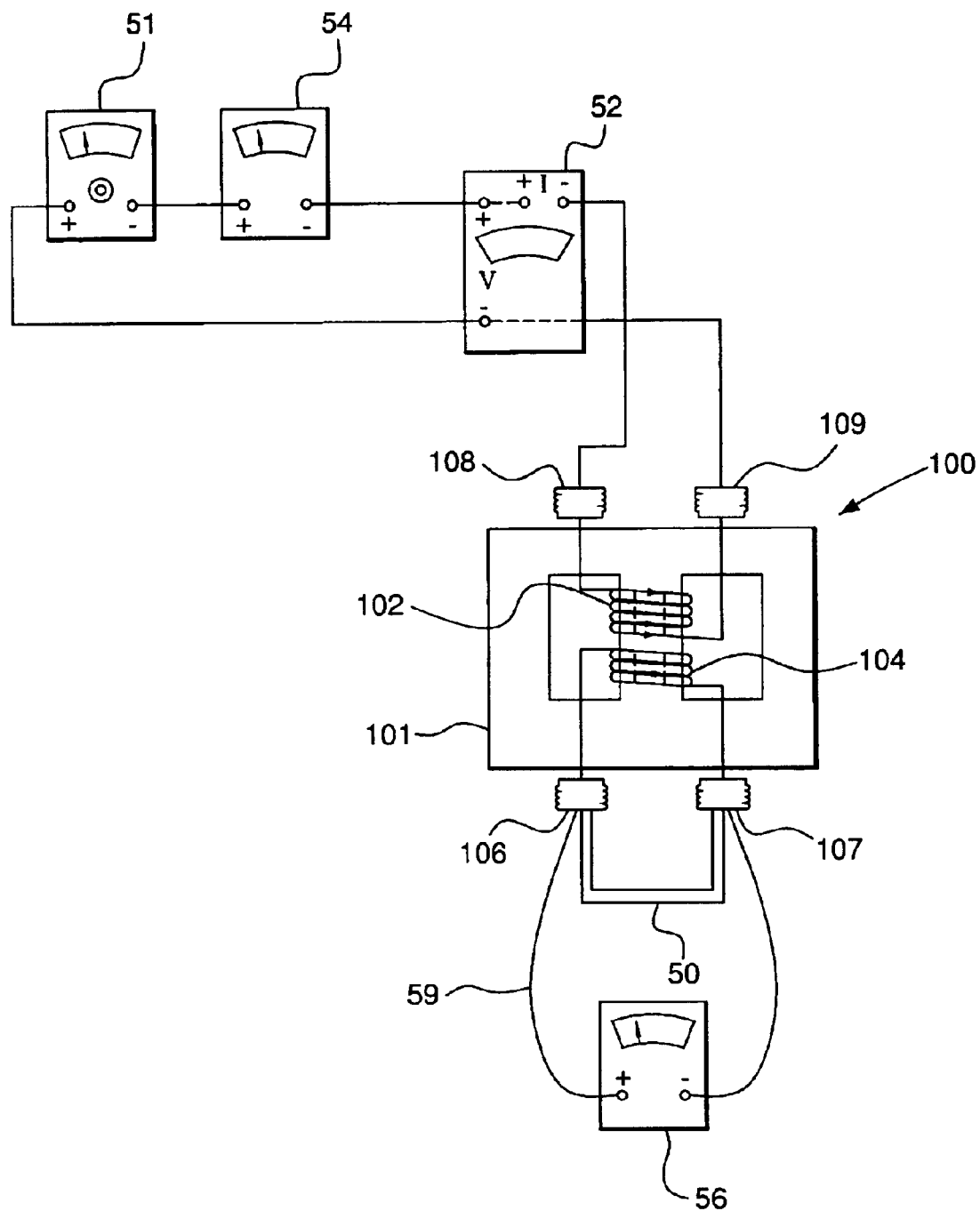
FIG. 3 is a diagrammatic illustration of the transformer depicted in FIG. 1, and instrumentation used to measure conductor losses in the transformer in accordance with the preferred method depicted in FIG. 2.
Figure 4:
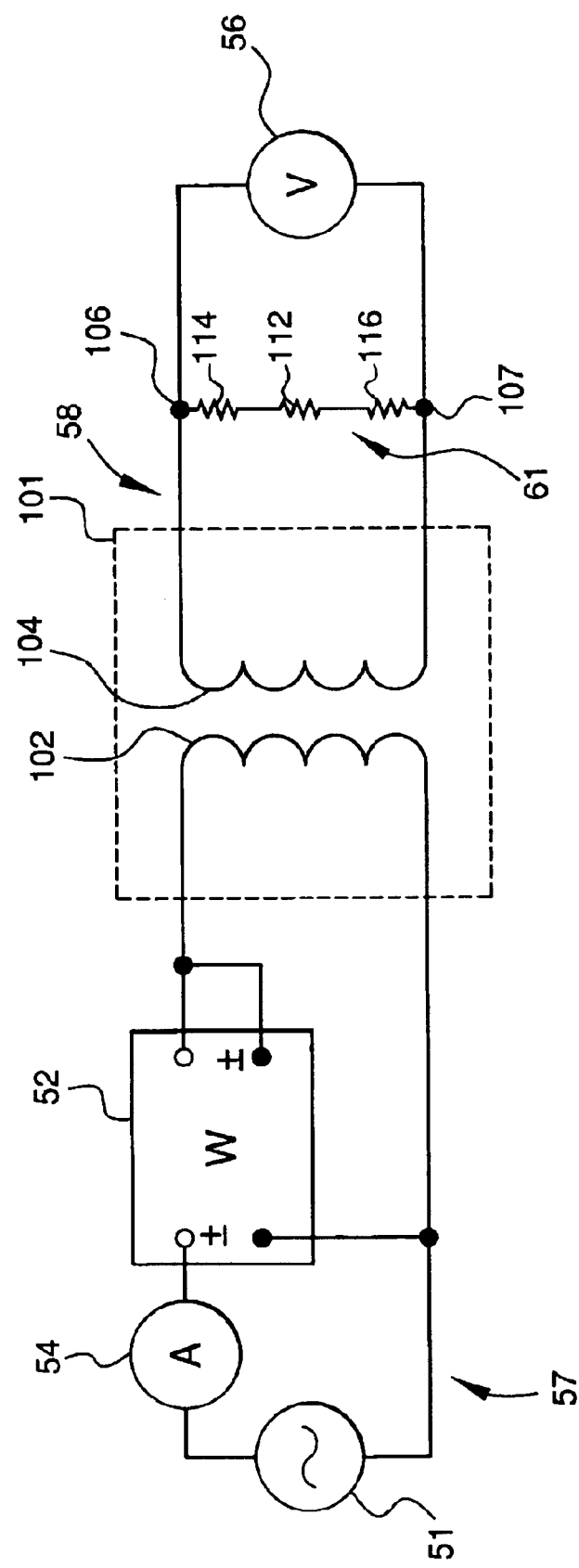
FIG. 4 is a schematic illustration of the transformer and instrumentation shown in FIGS. 1 and 3.

The method 10 can be performed using the above-noted ac power source 51, wattmeter 52, and ammeter 54, and a suitable voltmeter 56. The power source 51, wattmeter 52, and ammeter 54 can be electrically coupled to the HV winding 102 of the transformer 100 as shown in FIG. 3. This arrangement forms an electrical circuit 57, as shown schematically FIG. 4.

It should be noted that the particular arrangement of the wattmeter 52 within the electrical circuit 57 depicted in FIG. 3 is presented for exemplary purposes only. Those skilled in the art of transformer design will recognize that alternative arrangements are possible. (A description of the alternative arrangements is not necessary to an understanding of the invention, and therefore is not presented herein.)

The shorting bar 50 (or other suitable electrical conductor) and the voltmeter 56 can be electrically coupled to the LV winding 104 as shown in FIG. 3. In particular, the shorting bar 50 can be electrically coupled to the LV winding 104 by way of the respective first and second bushings 106, 107. (The shorting bar 50 is thus electrically coupled to a first and a second end of the LV winding 104.)

The voltmeter 56 can be electrically coupled to the LV winding 104 by way of leads 59, 60 and the respective first and second bushings 106, 107 (the leads 59, 60 do not directly contact the shorting bar 50). This arrangement forms an electrical circuit 58, as shown schematically in FIG. 4.

The voltmeter 56 measures the voltage across the first and second bushings 106, 107. The leads 59, 60 do not directly contact the shorting bar 50, as noted above. Hence, the voltage measured by the voltmeter 56 represents the voltage due to the resistance associated with the shorting bar 50. The significance of this feature is discussed below.

The resistance associated with the shorting bar 50 includes the resistance of the shorting bar 50 itself. The resistance associated with the shorting bar 50 can also include the contact resistance between the shorting bar 50 and the electrically conductive elements to which the shorting bar 50 is coupled, e.g., the first and second bushings 106, 107. The resistance of the shorting bar 50 is denoted by the element designated 112 in FIG. 4. The contact resistance between the shorting bar 50 and the first and second bushings 106, 107 is denoted by the elements designated 114 and 116, respectively, in FIG. 4. The shorting bar 50, and the resistance elements 114, 116 associated with the contact resistance between the shorting bar 50 and the first and second bushings 106, 107, form a branch 61 in the electrical circuit 58 (see FIG. 4).

Details of the method 10 are as follows. The method 10 is commenced by energizing the power source 51 (activity 12 of FIG. 2). Energizing the power source 51 causes an alternating current to flow through the electrical circuit 57 (and the HV winding 102). Preferably, the voltage produced by the power source 51 is adjusted so that the current in the electrical circuit 57 is approximately equal to the rated current for the HV winding 102. (A variable resistor can be installed in the electrical circuit 57 in alternative embodiments to facilitate adjustment of the current.)

The HV winding 102 produces magnetic flux in response to the alternating current in the electrical circuit 57. The core 101 conducts most of the magnetic flux to the LV winding 104. The magnetic flux induces a voltage across the LV winding 104.

The shorting bar 50, which is electrically coupled to the first and second bushings 106, 107, short circuits the LV winding 104. The voltage across the LV winding 104 thus causes a current to flow in the electrical circuit 58. The current in the electrical circuit 58, in conjunction with the resistance of the shorting bar 50 and the contact resistance between the shorting bar 50 and the respective first and second bushings 106, 107, produce a voltage across the first and second bushings 106, 107.

The wattmeter 52 provides an indication of the conductor losses of the transformer 100. More particularly, the wattmeter 52 measures the power delivered to the HV winding 102 (activity 14 of FIG. 2). The HV and LV windings 102, 104 are magnetically coupled by way of the core 101. Moreover, the reactance of the branch 61 of the electrical circuit 58 is assumed to be negligible in relation to the resistance thereof. In other words, the branch 61 is assumed to be purely resistive. Hence, the power delivered to the HV winding 102, as measured by the wattmeter 52, is approximately equal to the conductor losses of the transformer 100 (including the conductor losses associated with the LV winding 104) and, in addition, the power losses associated with the shorting bar 50. The power delivered to the HV winding 102 is hereinafter referred to as the "unadjusted conductor losses" of the transformer 100.

It should be noted that the power measured by the wattmeter 52 also includes the core losses of the transformer 100. The voltage across the HV winding 102 needed to obtain the desired current in the electrical circuit 57 is relatively low, however, due to the short-circuiting of the LV winding 104 by the shorting bar 50. Core losses are thus assumed to represent a negligible portion of the power measured by the wattmeter 52.

The current in the electrical circuit 57 is measured by the ammeter 54 (activity 15 of FIG. 2). The voltage across the first and second bushings 106, 107 is measured by the voltmeter 56 (activity 16).

The current in the branch 61 of the electrical circuit 58 is approximately equal to the current in the electrical circuit 57 multiplied by the turns (transformation) ratio of the transformer 100. The turns ratio of the transformer 100 equals the ratio of the number of turns in the HV winding 102 to the number of turns in the LV winding 104. An approximate value for the current in the branch 61 is thus calculated by multiplying the current in the electrical circuit 57, as measured by the ammeter 54, by the turns ratio of the transformer 100 (activity 18).

The reactance of the branch 61 of the electrical circuit 58 is assumed to be negligible in relation to the resistance thereof, as discussed above. In other words, the branch 61 is assumed to be purely resistive. Hence, the power dissipated across the first and second bushings 106, 107 is approximately equal to the current in the electrical circuit 58 multiplied by the voltage across the first and second bushings 106, 107.

An approximate value for the power dissipated across the first and second bushings 106, 107 can therefore be calculated by multiplying the current in the branch 61 of the electrical circuit 58, calculated in the above-described manner, by the voltage across the first and second bushings 106, 107 as measured by the voltmeter 56 (activity 20). The value resulting from this calculation is hereinafter referred to as the "shorting bar losses."

The voltage measured by the voltmeter 56 includes the voltage associated with the resistance of the shorting bar 50, and the voltage associated with the contact resistance between the shorting bar 50 and the respective first and second bushings 106, 107, as noted above (see FIG. 4). Hence, the shorting bars losses represent an approximate value for the power losses associated with the resistance of the shorting bar 50, and the contact resistance between the shorting bar 50 and the respective first and second bushings 106, 107.

The shorting bar losses are subtracted from the unadjusted conductor losses (activity 22). The unadjusted conductor losses, as discussed above, represent the approximate total conductor losses of the transformer 100 and, in addition, the losses associated with the shorting bar 50. Hence, the value obtained by subtracting the shorting bar losses from the unadjusted conductor losses represents the approximate total conductor losses of the transformer 100. This value is hereinafter referred to as the "adjusted conductor losses" of the transformer 100.

The method 10 can provide potential economic benefits to the manufacturers of transformers such as the transformer 100. In particular, the method 10 enables transformer manufacturers to quote lower, and potentially more accurate, values for conductor losses (and operating cost). The method 10 provides this benefit by eliminating the need to quote a value for the conductor losses that includes additional losses associated with the test equipment used to measure the conductor loss.

The purchase (sale) price of a transformer such as the transformer 100 is usually based, in part, on the estimated operating cost of the transformer, as discussed previously. Hence, lowering the estimated operating cost of a transformer can potentially increase the purchase price of the transformer. The use of the method 10 to provide a lower and potentially more accurate estimate the conductor losses (and operating cost) of a transformer can therefore enable a transformer manufacturer to obtain a higher purchase price for its transformers. In other words, the use of the method 10 can enable transformer manufacturers can avoid the economic penalties associated with quoting additional transformer losses (and operating costs) associated with the test equipment used to measure such losses.

Figure 5:
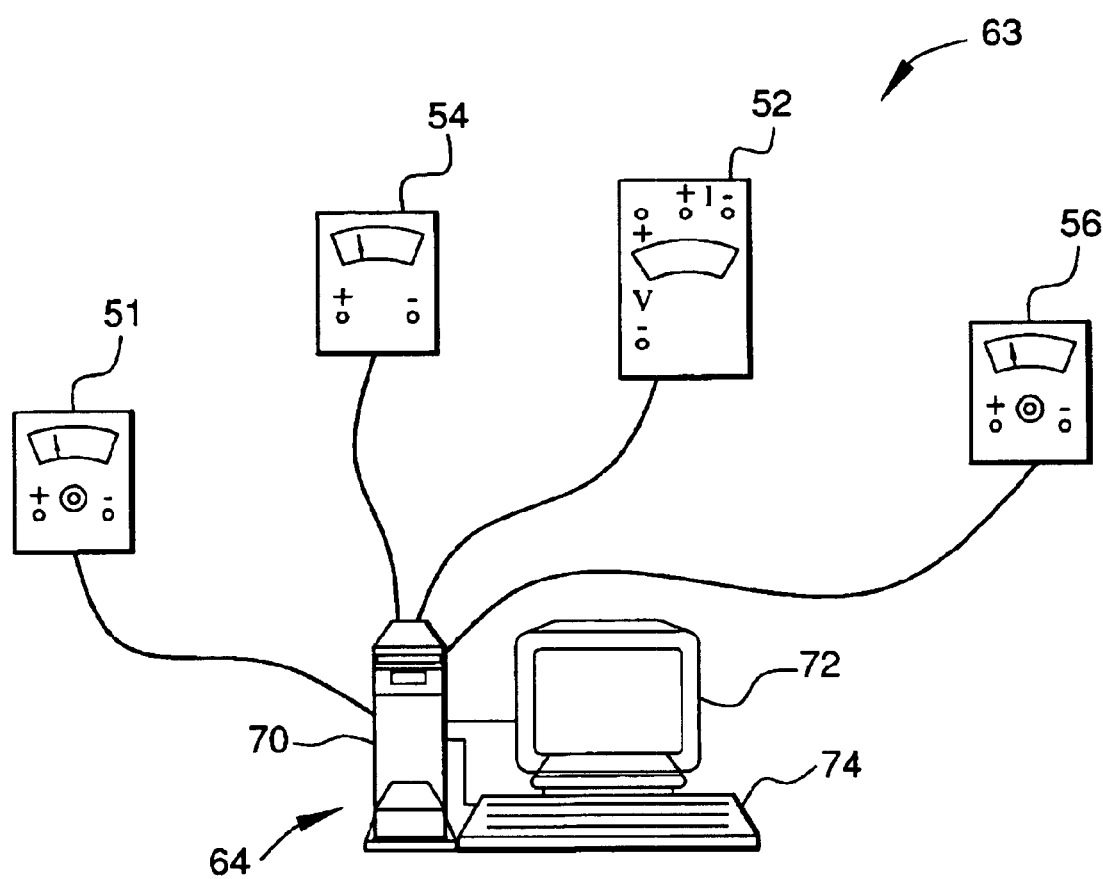
FIG. 5 is a diagrammatic illustration of a system for performing the preferred method shown in FIG. 2.
Figure 6:
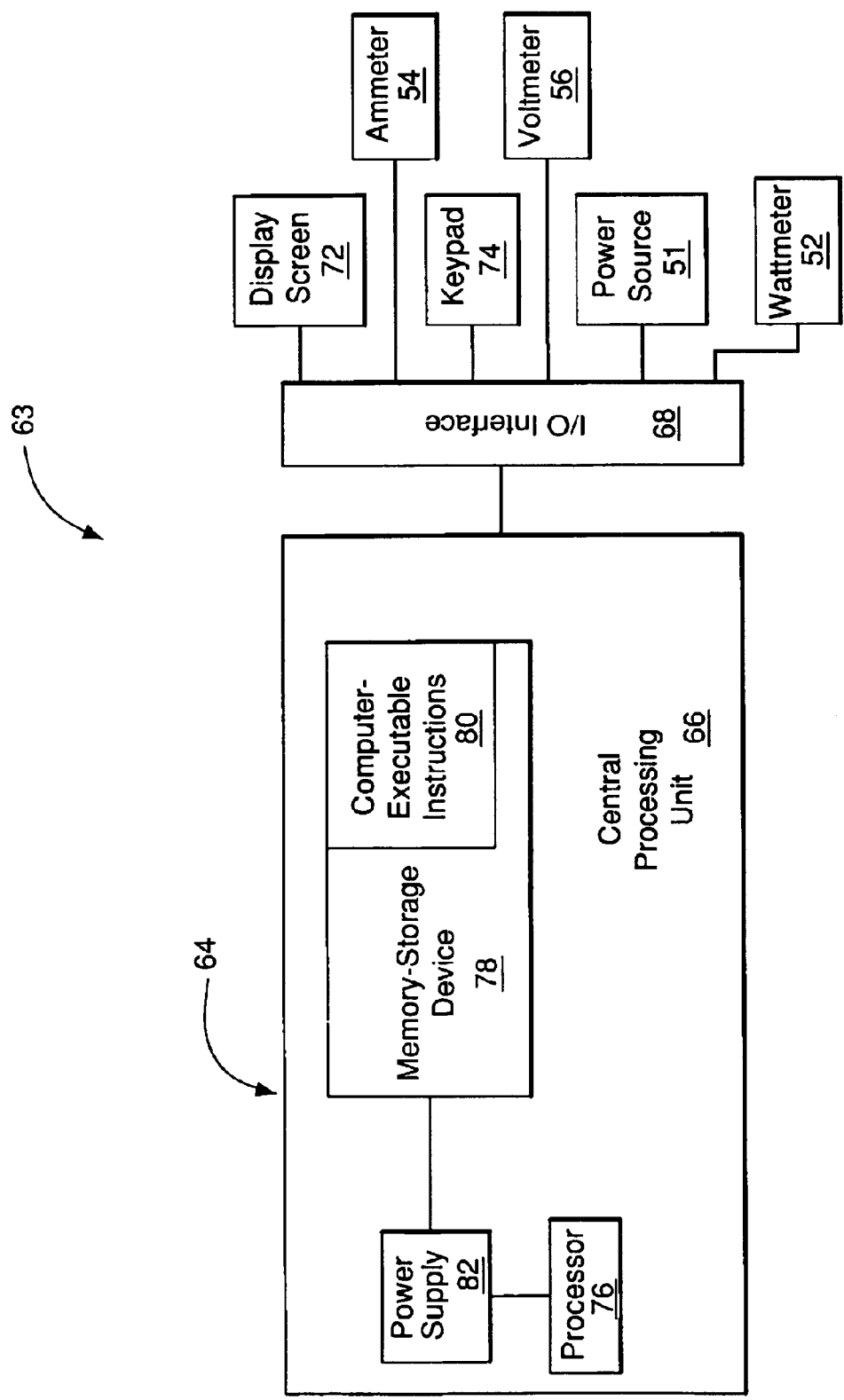
FIG. 6 is a block diagram of the system shown in FIG. 5.

The method 10 can be performed on a substantially automated basis. For example, the method 10 can be performed using a system 63 comprising the power source 51, wattmeter 52, ammeter 54, voltmeter 56, and a suitable computing device 64 (see FIGS. 5 and 6). The computing device 64 can be, for example, personal computer. Other types of computing devices, e.g., a programmable logic controller, a minicomputer, a mainframe computer, etc., can be used as the computing device in alternative embodiments.

The computing device 64 comprises a central processing unit 66, an input/output ("I/O") interface 68 electrically coupled to the central processing unit 66, and a casing 70 that houses the central processing unit 66 and the I/O interface 68. The computing device 64 can also comprise a display screen 72 and a keypad 74 that are each electrically coupled to the I/O interface 68.

The central processing unit 66 comprises a processor 76, a memory-storage device 78 electrically coupled to the processor 76, a set of computer-executable instructions 80 stored on the memory-storage device 78, and a power supply 82 electrically coupled to the processor 76 and the memory-storage device 78.

The power source 51, wattmeter 52, ammeter 54, and voltmeter 56 are communicatively coupled to the I/O interface 68 of the computing device 64 when used as part of the system 63. The computer-executable instructions 80 cause the computing device 64 to compute the adjusted conductor losses for the transformer 100 in accordance with the method 10. More particularly, the computer-executable instructions 80 cause the computing device to energize the power source 51, and to obtain data from the ammeter 54, wattmeter 52, and voltmeter 56. This data, as described above, corresponds respectively to the current in the electrical circuit 57, the power loss in the HV winding 102, and the voltage across the first and second bushings 106, 107.

The computer-executable instructions 80 compute the current in the electrical circuit 58, the unadjusted conductor losses, the shorting bar losses, and the adjusted conductor losses of the transformer 100 in the above-described manner. The adjusted conductor losses (and the other calculated and measured parameters associated with the method 10) can be displayed on the display screen 72, stored on the memory-storage device 78, transmitted to a central data base, etc. The computing device 64 can also be programmed to generate a report that documents the adjusted conductor losses of the transformer 100.

It is to be understood that even though numerous characteristics and advantages of the present invention have been set forth in the foregoing description, the disclosure is illustrative only and changes may be made in detail within the principles of the invention to the full extent indicated by the broad general meaning of the terms in which the appended claims are expressed.

For example, the shorting bar 50 can be used to short-circuit the HV winding 102, and the power source 51 can be used to energize the LV winding 104 in alternative versions of the method 10. The resulting current in the electrical circuit 58 can be measured by the ammeter 54, the power supplied to the LV winding 104 can be measured by the wattmeter 52, and the voltage across the HV winding 102 can be measured by the voltmeter 56 in the alternative method. The adjusted conductor losses can be calculated based on the noted measurements a manner substantially similar to that described above with respect to the preferred method 10.

In another variation on the preferred method 10, the power dissipated by the branch 61 of the electrical circuit 58 can be measured by a wattmeter electrically coupled to the electrical circuit 58, rather than calculated based on a voltage reading from the voltmeter 56.

What is claimed is:

1. A method for estimating conductor losses in a transformer having a first and a second winding, comprising:
   energizing the first winding while the second winding is short-circuited by an electrical conductor so that power is supplied to the first winding and a portion of the power is dissipated due to a resistance associated with the electrical conductor;
   measuring the power supplied to the first winding;
   calculating the portion of the power dissipated due to the resistance associated with the electrical conductor; and
   subtracting the portion of the power dissipated due to the resistance associated with the electrical conductor from the power supplied to the first winding.

2. The method of claim 1, wherein energizing the first winding while the second winding is short-circuited by an electrical conductor comprises energizing the first winding while the second winding is short-circuited by an electrical conductor electrically coupled to a first and a second bushing of the transformer.

3. The method of claim 2, wherein a resistance associated with the electrical conductor comprises a resistance of the electrical conductor and a contact resistance between the electrical conductor and the first and second bushings.

4. The method of claim 2, further comprising measuring a voltage across the resistance associated with the electrical conductor using a voltmeter electrically coupled to the first and second bushings.

5. The method of claim 1, wherein energizing the first winding while the second winding is short-circuited by an electrical conductor comprises energizing the first winding while the second winding is short-circuited by a shorting bar.

6. The method of claim 1, wherein energizing the first winding while the second winding is short-circuited by an electrical conductor comprises energizing the first winding using an alternating current power source.

7. The method of claim 1, wherein measuring the power supplied to the first winding comprises measuring the power supplied to the first winding using a wattmeter.

8. The method of claim 1, wherein energizing the first winding while the second winding is short-circuited comprises energizing a high-voltage winding of the transformer while a low-voltage winding of the transformer is short-circuited.

9. The method of claim 1, further comprising measuring a current in the first winding.

10. The method of claim 9, further comprising calculating a current in the second winding by multiplying the current in the first winding by a ratio of a number of turns in the first winding to a number of turns in the second winding.

11. The method of claim 10, further comprising measuring a voltage across the resistance associated with the electrical conductor.

12. The method of claim 11, wherein calculating the portion of the power dissipated due to the resistance associated with the electrical conductor comprises multiplying the current in the second winding by the voltage across the resistance associated with the electrical conductor.

13. A method for estimating conductor losses in a transformer, comprising:

supplying power to a first winding of the transformer while a second winding of the transformer is short-circuited by an electrical conductor;

measuring the power supplied to the first winding;

calculating power dissipated by the electrical conductor in response to supplying power to the first winding; and subtracting the power dissipated by the electrical conductor from the power supplied to the first winding.

14. The method of claim 13, wherein supplying power to a first winding of the transformer while a second winding of the transformer is short-circuited by an electrical conductor comprises supplying power to the first winding while the second winding is short-circuited by an electrical conductor electrically coupled to a first and a second bushing of the transformer.

15. The method of claim 14, further comprising:

calculating power dissipated by a contact resistance between the electrical conductor and the first and second bushings; and subtracting the power dissipated by the contact resistance from the power supplied to the first winding.

16. The method of claim 14, further comprising measuring a voltage across the electrical conductor using a voltmeter electrically coupled to the first and second bushings.

17. The method of claim 13, wherein supplying power to a first winding of the transformer while a second winding of the transformer is short-circuited by an electrical conductor comprises supplying power to the first winding while the second winding is short-circuited by a shorting bar.

18. The method of claim 13, wherein supplying power to a first winding of the transformer comprises supplying power to the first winding using an alternating current power source.

19. The method of claim 13, wherein supplying power to a first winding of the transformer while a second winding of the transformer is short-circuited by an electrical conductor comprises supplying power to a high-voltage winding of the transformer while a low-voltage winding of the transformer is short-circuited by an electrical conductor.

20. The method of claim 13, further comprising measuring a current in the first winding.

21. The method of claim 20, further comprising calculating a current in the second winding by multiplying the current in the first winding by a ratio of a number of turns in the first winding to a number of turns in the second winding.

22. The method of claim 21, further comprising measuring a voltage across the electrical conductor.

23. The method of claim 22, wherein calculating power dissipated by the electrical conductor in response to supplying power to the first winding comprises multiplying the current in the second winding by the voltage across the electrical conductor.

24. A method for estimating conductor losses in a transformer, comprising:

electrically coupling an electrical conductor to a first and a second end of a first winding of the transformer;

energizing a second winding of the transformer;

measuring power delivered to the second winding;

calculating power dissipated by resistance associated with the electrical conductor in response to energization of the second winding; and subtracting the power dissipated by the resistance associated with the electrical conductor from the power delivered to the first winding.

25. The method of claim 24, wherein the resistance associated with the electrical conductor comprises the resistance of the electrical conductor.

26. The method of claim 25, wherein electrically coupling an electrical conductor to a first and a second end of a first winding of the transformer comprises electrically coupling the electrical conductor to a first and a second bushing, the first and second bushings being electrically coupled to the respective first and second ends of the first winding.

27. The method of claim 26, wherein the resistance associated with the electrical conductor further comprises a contact resistance between the electrical conductor and the first and second bushings.

28. The method of claim 26, further comprising measuring a current in the second winding.

29. The method of claim 28, further comprising calculating a current in the first winding by multiplying the current in the second winding by a ratio of a number of turns in the second winding to a number of turns in the first winding.

30. The method of claim 29, further comprising measuring a voltage across the electrical conductor.

31. The method of claim 30, wherein calculating power dissipated by resistance associated with the electrical conductor in response to energization of the second winding comprises multiplying the current in the first winding by the voltage across the electrical conductor.

32. A method for estimating conductor losses in a transformer, comprising:

supplying power to a first winding of the transformer while a first and a second end portion of a second winding of the transformer are electrically coupled by an electrical conductor;

quantifying the power supplied to the first winding of the transformer;

quantifying power losses across the electrical conductor in response to supplying power to the first winding of the transformer; and subtracting the power losses from the power supplied to the first winding of the transformer.

33. A method, comprising:

energizing a first winding of a transformer by supplying power to the first winding while a second winding of the transformer is short-circuited by an electrical conductor;

measuring the power supplied to the first winding; and adjusting the measured power to account for power losses associated with the electrical conductor in response to the energization of the first winding thereby providing an estimate of conductor losses in the transformer.

34. A system for estimating conductor losses in a transformer, comprising:

a power supply for energizing a first winding of the transformer;

a wattmeter for measuring power supplied to the first winding;

an ammeter for measuring a current in the first winding;

a voltmeter for measuring a voltage across an electrical conductor electrically coupled to a first and a second end of a second winding of the transformer; and a computing device comprising (i) an input/output interface for communicating with the power supply, wattmeter, ammeter, and voltmeter, and (ii) a central processing unit electrically coupled to the input/output interface and comprising:
   a processor electrically coupled to the input/output interface;
   a memory-storage device electrically coupled to the processor;
   a power supply electrically coupled to the processor and the memory-storage device; and
   a set of computer-executable instructions stored on the memory-storage device for:
      causing the power source to energize the first winding;
      causing the wattmeter to measure the power supplied to the first winding;
      causing the ammeter to measure the current in the first winding;
      causing the voltmeter to measure the voltage across the electrical conductor;
      calculating power dissipated by the electrical conductor in response to energization of the first winding based on the current in the first winding and the voltage across the electrical conductor; and
      subtracting the power dissipated by the electrical conductor from the power supplied to the first winding.

\* \* \* \* \*